Feb. 3, 1970 G. R. STANLEY 3,493,879
HIGH POWER HIGH FIDELITY SOLID STATE AMPLIFIER
Filed Feb. 12, 1968
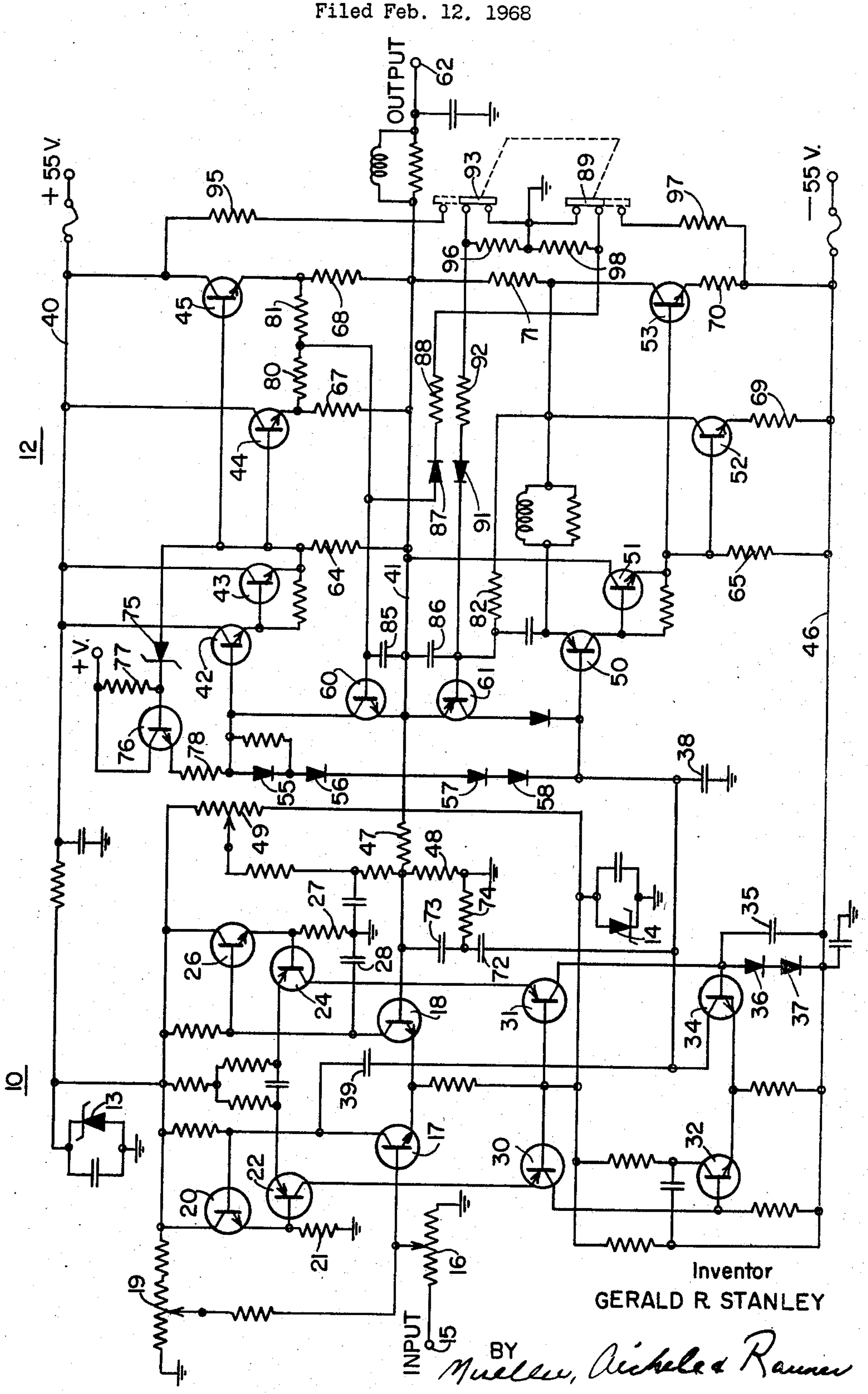
Inventor
GERALD R. STANLEY
BY Mueller, Aichele & Rauner
Attys.

United States Patent Office 3,493,879
Patented Feb. 3, 1970

3,493,879
HIGH POWER HIGH FIDELITY SOLID STATE AMPLIFIER

Gerald R. Stanley, Mishawaka, Ind., assignor to International Radio & Electronics Corporation, Elkhart, Ind., a corporation of Indiana
Filed Feb. 12, 1968, Ser. No. 704,625
Int. Cl. H03f *3/18*
U.S. Cl. 330—17 10 Claims

ABSTRACT OF THE DISCLOSURE

High-power high-fidelity solid state amplifier including voltage amplifier and power amplifier both having direct current coupled stages. The power amplifier has single-ended push-pull sections, each including a fast response transistor providing the output for small (high-impedance) load currents and controlling high power homogeneous base transistors for large load currents. The voltage amplifier has differential input amplifier stages and a high impedance output stage driven by an emitter follower stage, and acting therewith as a differential amplifier at low frequencies. A bookstrap circuit from the power amplifier to the voltage amplifier increases drive and improves linearity, and a protecting circuit limits dissipation of the output transistors.

BACKGROUND OF THE INVENTION

There are many applications wherein it is desired to use a high-power, high-fidelity amplifier which includes only solid state components for compact size and trouble free operation. Prior solid state amplifiers have not provided the output power and voltage required in many applications. Further, they have not provided extremely high fidelity performance over a frequency range extending from direct current operation to the highest audible frequencies. Another problem has been that the cost of prior high-fidelity high-power amplifiers has been objectionable high.

It is desired to provide a high-power high-fidelity amplifier which is suitable for general applications including high-fidelity applications where a relatively high power level is required, laboratory applications where extremely high quality performance is desired, and high power applications where fidelity is not critical. By providing a single amplifier which satisfies all of these requirements, production quantities can be built to a level such that significant cost savings are obtained, so that a high quality amplifier can be provided at a cost within reach of many users who would not previously purchase such an amplifier because of the extremely high cost thereof.

Summary of the invention

It is an object of the invention to provide an improved solid state amplifier which provides large output power over a wide bandwidth.

Another object of the invention is to provide a high power solid state amplifier including direct current coupled stages, with transistors providing fast response time being operative for high frequency signals and high power transistors having a slower response time providing the large load currents required at lower frequencies.

A further object of the invention is to provide a high power solid state amplifier including a voltage amplifier portion having a wide bandwidth and a solid state power amplifier portion which provides the large output currents and voltages desired, with a bookstrap circuit coupled from an output stage to the voltage amplifier portion to insure adequate drive and improve the linearity.

Another object of the invention is to provide a high power amplifier including a voltage amplifier with differential amplifier stages operative at low frequencies and wherein one side of the differential amplifiers is bypassed at high frequencies and the transistors of the final stage form an emitter follower driving a grounded base transistor.

A further object of the invention is to provide a high power amplifier including a protecting circuit responsive to the load current and voltage in the power transistors to control the drive to the power amplifier to hold the same within limits wherein the power transistors will not be damaged.

In accordance with the invention, a high power direct current coupled solid state amplifier is provided including a voltage amplifier and a power amplifier. The voltage amplifier includes an input differential amplifier for receiving the input signal and a feedback signal from the power amplifier. The voltage amplifier stages have wide bandwidth and provide a large voltage swing for driving the power amplifier. The side of the differential amplifier to which the feedback is applied is bypassed at high frequencies so that the amplifier functions as a single ended amplifier having a grounded base high impedance output stage driven by an emitter follower stage having a relatively low impedance. The base of the grounded base stage is driven by the signal at low frequencies to provide differential action which increases the gain at low frequencies. The signal output of the voltage amplifier is applied to two separate sections of the power amplifier connected to opposite polarity sides of the power supply, with a direct current voltage shifting the input signal to different levels for the two sections. The input transistors of the two sections are of opposite conductivity types so that the signals through the two sections have opposite polarities and the outputs of the two sections are directly connected as a single ended push-pull amplifier. Each section has a fast response transistor providing the output for high frequency (high impedance) signals, and high power transistors coupled thereto to provide large currents for low frequency signals. A bootstrap circuit connected from the power amplifier is coupled to the last stage of the voltage amplifier and provides continued and increased drive so that maximum output power is obtained. A protection circuit responds to the current in the power transistors to cut down the drive when the current and voltage exceed predermined values to thereby protect the transistors from breakdown.

Brief description of the drawings

The single figure of the drawing is a circuit diagram of the high power solid state amplifier for general application.

The amplifier of the invention includes a voltage amplifier or preamplifier 10 and a power amplifier 12. Voltage for operating the amplifier is obtained from conductor 40 which provides a positive voltage which may be of the order of +55 volts and conductor 46 which provides a negative voltage which may be of the order of −55 volts. The positive voltage applied to preamplifier 10 is regulated by Zener diode 13, and the negative voltage applied to certain points is regulated by Zener diode 14.

The input to the preamplifier 10 is applied at terminal 15 and is coupled through level control potentiometer 16 to the base of transistor 17, which together with transistor 18 forms a first emitter coupled differential amplifier. A bias potential is derived from potentiometer 19 and applied to the base of transistor 17, with the adjustment of potentiometer providing the input balance to the differential amplifier. A feedback voltage is applied from the power amplifier 12 to the base of transistor 18, being applied through conductor 41, and divided down by the resistors 47 and 48. A bias potential is applied to the base of transistor 18 from potentiometer 49 connected between the positive and negative supplies.

The output of transistor 17 is applied to the emitter follower stage including transistor 20 which acts to maximize the gain bandwidth product. The output of transistor 20 is developed across resistor 21 and applied to the base of transistor 22, which together with transistor 24 forms a second emitter coupled differential amplifier. Similarly the output of transistor 18 is applied to the emitter follower stage including transistor 26, and the voltage across emitter resistor 27 thereof is applied to the base of transistor 24 of the second differential amplifier. The output of transistor 18 (input to transistor 26) is bypassed by capacitor 28 which substantially attenuates the high frequencies.

The outputs of transistors 22 and 24 are applied to transistors 30 and 31 which are connected as grounded base stages to provide high gain-bandwidth and impedance isolation from the negative supply conductor 46 which is common to the input of transistor 32. The high impedance outputs of the transistors 30 and 31 are current limited, and are applied to the base electrodes of transistors 32 and 34 which form a third differential amplifier pair. The base of transistor 34 is bypassed by capacitor 35 so that at high frequencies there is no differential action. The base of transistor 34 is connected to the negative supply potential through diodes 36 and 37 so that this transistor functions to a significant degree as a grounded base stage. This stage is driven by emitter follower stage 32 which drives the emitter of transistor 34. The output of the preamplifier is derived from the collector of transistor 34 and applied across capacitor 38.

The power amplifier 12 includes two sections operating as a single ended push-pull pair. The first section is connected between the positive voltage supply conductor 40 and the output line 41 and includes transistors 42, 43, 44 and 45. The second section is connected between the minus supply potential conductor 46 and the output line 41 and includes transistors 50, 51, 52 and 53. The input across capacitor 38 is applied directly to the base of transistor 50 and is shifted to a higher DC potential by diodes 55, 56, 57 and 58 for application to the base of transistor 42. As will be described, current is continuously supplied through diodes 55 to 58 so that a constant inter-base voltage for the two amplifier sections is developed thereacross.

Transistors 42 and 50 serve as driver transistors for applying signals to the high power output circuits formed by transistors 43, 44 and 45 in the upper section, and by transistors 51, 52 and 53 in the lower section. Driver transistors 42 and 50 are of opposite conductivity types to apply opposite polarity voltage swings to the power transistors to provide push-pull operation. Transistors 60 and 61 are included in a limiting or protecting circuit for the output transistors, as will be described. To provide a high power output with adequate bandwidth, the power amplifier includes medium power, fast response time transistors 43 and 51 which carry the quiescent bias. The resistors 64 and 65 in the emitter circuits of these transistors are relatively small (of the same order of magnitude as the load).

The amplifier of the invention is adapted to be used over a wide range of power output and load impedance conditions. Bias is applied to the transistors 42 and 50 such that when the load connected to the output terminal 62 of the amplifier is of high impedance, the transistors 43 and 51 can supply the load and transistors 44, 45, 52 and 53 will not be rendered conducting. When a load having low impedance is connected to the output terminal 62 and the load current requirements are greater, the voltages developed across resistors 64 and 65, which are applied between the base and emitter of the power transistors 44 and 45, and of the power transistors 52 and 53, respectively, will reach a value to cause these transistors to conduct. In such case the load current will be provided principally by the high power transistors 44, 45, 52 and 53. These transistors can be homogeneous base units which provide heavy current and have large breakdown voltages. Although these transistors have relatively slow response times, they are used as boosters for the transistors 43 and 50 which have fast response time. The resistors 64 and 65 must be small so that there is no significant second derivative in the voltage transfer characteristic of the amplifier when the power transistors are rendered conducting and effectively short out these resistors. For an amplifier operating to feed a load having an impedance from 4 to 16 ohms, the resistors 64 and 65 may have a value of the order of 5 or 6 ohms. The bias for the transistors is selected so that the power transistors do not carry any quiescent current. This provides a maximum usable gain bandwidth product with large breakdown voltage and bias stability, good linearity and high frequency response, and high power efficiency. Stable operation results so that no critical adjustments are required. As illustrated, a plurality of output power transistors can be connected in parallel (transistors 44 and 45, transistors 52 and 53) for increased power dissipation, while maintaining the gain bandwidth product. The stages are direct current coupled providing operation for signals at frequencies from direct current to the highest audio frequencies.

The resistors 67 and 68 connected in the emitter circuits of transistors 44 and 45 cause the transistors 44 and 45 to divide the load substantially uniformly in the presence of variations in transistor characteristics. Resistors 69 and 70 connected to the emitters of transistors 52 and 53 have the same function. The resistors 67 and 68 are also used in the limiting circuit to be described, as is the resistor 71 connected in the collector circuit of the transistors 52 and 53.

To provide continuous drive current for the power amplifier, positive feedback from the power amplifier 12 is applied to the last stage of the voltage amplifier 10. This feedback also improves the linearity of the power amplifier. Inasmuch as the amplifier is to be used for direct current as well as alternating current amplification, feedback cannot be provided by an alternating current coupling through a capacitor. In accordance with the invention, feedback is provided by a constant current source controlled by a Zener diode connected to the output stage, the Zener diode being indicated by 75 and the constant current source including transistor 76. The Zener diode is connected through resistor 77 to the voltage +V which is greater than the voltage on conductor 40 to supply current continuously through the Zener diode 75 so that the reference voltage is established thereby. This voltage controls the conduction of transistor 76 to thereby control the current applied through resistor 78 and the diodes 55–58 to the collector of transistor 34, which is the output stage of the voltage amplifier 10. Although the Zener diode is shown connected from the base of the power amplifier transistors 44 and 45, this may be connected to the power amplifier at some other point. It has been found that the connection illustrated minimizes the distortion and provides the necessary overdrive for maximum power efficiency, independently of frequency. This also serves to keep power supply ripple and variations out of the last voltage amplifier. This feedback may be considered as a pre-regulator.

To prevent burnout of the output power transistors, it is desirable to provide a limiting circuit which is responsive to the current through the power transistors and which is adjusted in accordance with the instantaneous potential thereacross. As previously stated, the transistors 60 and 61 are provided in the limiter circuits. Considering the positive section of the circuit, resistors 67 and 68 develop a voltage thereacross in accordance with the transistor output current. Resistors 80 and 81 supply this voltage to the base of transistor 60. Similarly resistor 71 develops a voltage in accordance with the current through transistors 52 and 53 in the negative section of the amplifier. The voltage across resistor 71 is applied through resistor 82 to the base of transistor 61.

Transistor 60 and 61 have output electrodes connected between the bases of transistors 42 and 50 and the output conductor 41, respectively. When the transistors 60 and 61 conduct, they effectively short the input applied to the bases of transistors 42 and 50 to reduce the drive so that the power dissipation of the output transistors is reduced. It is desirable to allow very short high current pulses which will not damage the output transistors to go without limiting. To accomplish this, capacitors 85 and 86 are connected across the base and emitter of transistors 60 and 61.

Resistors 67, 68 and 71 are made as small as possible to minimize the power dissipation therein. They may have values of the order of 0.1 or 0.2 ohm. However, it is necessary to provide a sufficient voltage thereacross to render the transistors 60 and 61 conducting to limit the drive to the output transistors. The transistors 60 and 61 can be germanium transistors which have a low base-to-emitter voltage drop which will operate with a low voltage from the resistors 67, 68 and 71, so that the resistors can have values which minimize the power dissipation therein.

In order to render the limiter transistors 60 and 61 responsive to the voltage across the power transistors, the circuit including diode 87, resistor 88 and switch contact 89 is connected between the base of transistor 60 and ground, and the circuit including diode 91, resistor and switch contact 93 is connected between the base of transistor 61 and ground. The diodes 87 and 91 prevent forward biasing of the limiter transistors 60 and 61. Modified limiting characteristics to allow the driving of high hysteresis loads can be provided by adding a fixed bias to the voltages applied through the resistors 88 and 92. This is accomplished by the voltage divider including resistors 95 and 96 which applies a voltage to resistor 92 when the switch contact 93 is moved upward to the dotted position. Similarly, the resistors 97 and 98 form a voltage divider to apply a negative bias through contacts 89, in the lower position thereof, and through resistor 88 and diode 87 to the base of transistor 60.

Transistor 34 which forms the last stage of the voltage amplifier 10, is connected as a grounded base amplifier at high frequency and is driven to a limited extent at low frequency. As previously stated, the output of transistor 18 of the input differential amplifier is bypassed at high frequencies so that the entire voltage amplifier 10 operates as a single ended amplifier at high frequencies. The base of transistor 34 is also bypassed by capacitor 35 to prevent any input to the base at high frequencies. The transistor 32 functions as an emitter follower to drive the emitter of transistor 34 so that the input impedance is moderate and the gain bandwidth product is optimum. At low frequencies there is some drive from the grounded base stage 31 to the base of transistor 34 which supplements the drive applied to the emitter, so that the gain is increased somewhat at low frequencies.

Transistor 32 is driven by the grounded base stage 30 which has a high output impedance and this provides a current limited drive to the base of transistor 32. This in turn provides a current limited output from transistor 34. The voltage amplifier 10 has a high output impedance and high gain over a wide bandwidth. The capacitor 38 coupled across the output of transistor 34 integrates the output and provides phase shift so that the input to the power amplifier 12 has the desired characteristics. This controls the slewing rate (voltage change with time) so that the high frequency drive to the power amplifier is held to a given maximum to provide a safety margin for the power output stages.

Feedback is provided from the collector of transistor 34 through capacitor 39 to the base of transistor 20 for high frequency stabilization with a minimum increase in saturation time. A phase advance feedback network is connected from the voltage amplifier output (collector of transistor 34) to the base of input transistor 18, which includes capacitors 72 and 73 and resistor 74. As previously stated, both positive and negative supplies for the voltage amplifier are regulated, by Zener diodes 13 and 14, so that the voltage amplifier is substantially immune to power supply variations.

The power amplifier as described operating from a positive supply voltage of +55 volts and a negative supply voltage of −55 volts will produce an output voltage swing of the order of 35 volts. Two amplifiers as illustrated can be connected in phase opposition to provide a total output voltage swing of 70 volts. This is the voltage commonly used in public address systems. It may be desired to provide two amplifiers in the same cabinet so that the two amplifiers can be used in stereo systems or may be connected in opposition for increasing the output voltage swing as set forth above.

The amplifier of the invention provides high fidelity and high gain in a relatively simple non-critical circuit. The amplifier is suitable for use with a range of output impedances and may be used for a wide range of power outputs, as may be required in different applications. The amplifier can be used for high gain direct current amplification, and also for a wide range of frequencies. By connecting two amplifiers in phase opposition a large output voltage swing can be provided while maintaining supply voltages and components as used for lower output voltage swings. The amplifier includes a limiting circuit for protecting the output transistors against danger caused by excessive power dissipation.

I claim:

1. A power amplifier circuit having first and second sections operating in push-pull connected in series between first and second supply voltage conductors and with the common junction therebetween connected to an output conductor for connection to a load, such circuit including in combination, first and second transistors each having a pair of output electrodes and an input electrode for receiving push-pull signals, first impedance means connected in series with said output electrodes of said first transistor between the first supply voltage conductor and the output conductor, second impedance means connected in series with said output electrodes of said second transistor between the output conductor and the second supply voltage conductor, first and second high power semiconductor means having input, common and output electrodes, means connecting said input and common electrodes of said high power semiconductor means across said first and second impedance means respectively, means connecting said output and common electrodes of said first semiconductor means between the first supply voltage conductor and the output conductor and including third impedance means connected in series with said output and common electrodes, and means connecting said output and common electrodes of said second semiconductor means between the output conductor and the second supply voltage conductor and including fourth impedance means connected in series with said output and common electrodes, means applying bias voltages to said first and second transistors, said bias voltages being related to the values of said first and second impedance means such that said first and second high power semiconductor means are non-conducting at low signal outputs and are conducting at high signal outputs, and first and second semiconductor devices responsive to the voltages across said third and fourth impedance means respectively and coupled to said first and second transistors for reducing the drive applied thereto in response to voltages across said third and fourth impedance means which reach a predetermined value.

2. A power amplifier circuit in accordance with claim 1 wherein said first and second impedance means each has a value of the same order of magnitude as the impedance of the load.

3. A power amplifier circuit in accordance with claim 1 including third and fourth transistors of complementary types coupled to said first and second transistors respectively for applying signals thereto, and means for applying signals to said third and fourth transistors including bias means for shifting the direct current potential applied to said third and fourth transistors.

4. A power amplifier circuit in accordance with claim 1 wherein said first and second semiconductor devices are germanium transistors responsive to voltages across said third and fourth impedance means which are small compared to the voltage between the supply voltage conductors.

5. An amplifier circuit including a voltage amplifier and a power amplifier, said voltage amplifier having first and second transistors forming a differential amplifier, means applying input signals to said first transistor, means applying feedback signals from said power amplifier to said second transistor, third and fourth transistors having emitter electrodes connected together, impedance means connecting said emitter electrodes to a reference potential, means applying signals from said first transistor to the base electrode of said third transistor, means applying signals from said second transistor to the base electrode of said fourth transistor, high frequency bypass means connecting said base electrode of said fourth transistor to the reference potential, and means for applying signals from the collector electrode of said fourth transistor to said power amplifier, whereby said third and fourth transistors operate as a differential amplifier for low frequency signals and at high frequencies said fourth transistor operates as a grounded base amplifier and said third transistor operates as an emitter follower transistor which drives said fourth transistor.

6. An amplifier circuit in accordance with claim 5 wherein said power amplifier includes first and second sections connected in a single ended push-pull circuit, and an input circuit for said power amplifier including capacitor means connecting said collector electrode of said fourth transistor to a reference potential, a pair of complementary transistors for providing push-pull input signals to said first and second sections, and means applying the signal across said capacitor means to said complementary transistors including bias means shifting the direct current level of the signal applied to one of said complementary transistors.

7. An amplifier circuit in accordance with claim 6 wherein said bias means includes diode means and a regulating transistor connected in series therewith between voltage supply means and said collector electrode of said fourth transistor, and feedback means coupled to said power amplifier for controlling the conductivity of said regulating transistor.

8. An amplifier circuit in accordance with claim 7 wherein said feedback means includes a Zener diode for providing a voltage reference.

9. An amplifier circuit in accordance with claim 6 wherein each of said sections includes a first output transistor and impedance means connected in series with the output electrodes of said first output transistor between a supply voltage conductor and an output conductor for connection to a load, and a second high power output transistor having input and common electrodes connected across said impedance means and having an output electrode and said common electrodes connected between the supply voltage conductor and the output conductor, with said bias means controlling the conductivity of said first output conductivity in relation to the value of said impedance means such that said second high power semiconductor means is non-conducting at low signal outputs and is conducting at high signal outputs.

10. An amplifier circuit in accordance with claim 9 wherein each of said sections includes further impedance means connected in series with said output and common electrodes of said second output transistor, a germanium transistor coupled to said complementary transistor associated with such section for attenuating the signals applied thereby, and means applying the voltage across said further impedance means to said germanium transistor for controlling the conductivity thereof to thereby control the power dissipation of said second output transistor.

References Cited

UNITED STATES PATENTS

| | | | |
|---|---|---|---|
| 3,077,566 | 2/1963 | Vosteen | 330—14 |
| 3,376,388 | 4/1968 | Reiffin | 330—15 X |

FOREIGN PATENTS

| | | |
|---|---|---|
| 1,188,141 | 3/1965 | Germany. |

ROY LAKE, Primary Examiner

J. B. MULLINS, Assistant Examiner

U.S. Cl. X.R.

330—28, 30, 20, 26